US012085515B2

United States Patent
Lin et al.

(10) Patent No.: US 12,085,515 B2
(45) Date of Patent: Sep. 10, 2024

(54) METHODS AND SYSTEMS FOR SELECTING WAFER LOCATIONS TO CHARACTERIZE CROSS-WAFER VARIATIONS BASED ON HIGH-THROUGHPUT MEASUREMENT SIGNALS

(71) Applicant: KLA Corporation, Milpitas, CA (US)

(72) Inventors: Brian C. Lin, Zhubei (TW); Jiqiang Li, Shanghai (CN); Song Wu, Shanghai (CN); Tianrong Zhan, Shanghai (CN); Andrew Lagodzinski, Livermore, CA (US)

(73) Assignee: KLA Corporation, Milpitas, CA (US)

( * ) Notice: Subject to any disclaimer, the term of this patent is extended or adjusted under 35 U.S.C. 154(b) by 344 days.

(21) Appl. No.: 17/506,201

(22) Filed: Oct. 20, 2021

(65) Prior Publication Data

US 2023/0063102 A1 Mar. 2, 2023

Related U.S. Application Data

(60) Provisional application No. 63/236,797, filed on Aug. 25, 2021.

(51) Int. Cl.
*G01N 21/95* (2006.01)
(52) U.S. Cl.
CPC .................. *G01N 21/9501* (2013.01)
(58) Field of Classification Search
CPC ..... H01L 22/12; H01L 22/20; G01N 21/9501; G01N 2021/8867; G01B 11/0625; G01B 21/02; G01B 2210/56; G03F 7/706833

(Continued)

(56) References Cited

U.S. PATENT DOCUMENTS 5,608,526 A  3/1997 Piwonka-Corle et al.
5,859,424 A  1/1999 Norton et al.
(Continued)

FOREIGN PATENT DOCUMENTS

KR  10-2172768  11/2020

OTHER PUBLICATIONS

Shchegrov et al. , TW201531662 A:, "Measurement Of Multiple Patterning Parameters", Date Published: Aug. 16, 2015 (Year: 2015).*

(Continued)

*Primary Examiner* — John H Le
(74) *Attorney, Agent, or Firm* — Spano Law Group; Joseph S. Spano (57) ABSTRACT

Methods and systems for selecting measurement locations on a wafer for subsequent detailed measurements employed to characterize the entire wafer are described herein. High throughput measurements are performed at a relatively large number of measurement sites on a wafer. The measurement signals are transformed to a new mathematical basis and reduced to a significantly smaller dimension in the new basis. A set of representative measurement sites is selected based on analyzing variation of the high throughput measurement signals. In some embodiments, the spectra are subdivided into a set of different groups. The spectra are grouped together to minimize variance within each group. Furthermore, a die location is selected that is representative of the variance exhibited by the die in each group. A spectrum of a measurement site and corresponding wafer location is selected to correspond most closely to the center point of each cluster.

20 Claims, 7 Drawing Sheets

(58) Field of Classification Search
USPC .......................................................... 702/40
See application file for complete search history.

(56) References Cited

U.S. PATENT DOCUMENTS

| | | | |
|---|---|---|---|
| 6,023,338 | A | 2/2000 | Bareket |
| 6,429,943 | B1 | 8/2002 | Opsal et al. |
| 6,716,646 | B1 | 4/2004 | Wright et al. |
| 6,778,275 | B2 | 8/2004 | Bowes |
| 6,787,773 | B1 | 9/2004 | Lee |
| 6,992,764 | B1 | 1/2006 | Yang et al. |
| 7,242,477 | B2 | 7/2007 | Mieher et al. |
| 7,321,426 | B1 | 1/2008 | Poslavsky et al. |
| 7,406,153 | B2 | 7/2008 | Berman |
| 7,478,019 | B2 | 1/2009 | Zangooie et al. |
| 7,626,702 | B2 | 12/2009 | Ausschnitt et al. |
| 7,656,528 | B2 | 2/2010 | Abdulhalim et al. |
| 7,826,071 | B2 | 11/2010 | Shchegrov et al. |
| 7,842,933 | B2 | 11/2010 | Shur et al. |
| 7,873,585 | B2 | 1/2011 | Izikson |
| 7,929,667 | B1 | 4/2011 | Zhuang et al. |
| 7,933,026 | B2 | 4/2011 | Opsal et al. |
| 8,068,662 | B2 | 11/2011 | Zhang et al. |
| 8,138,498 | B2 | 3/2012 | Ghinovker |
| 9,291,554 | B2 | 3/2016 | Kuznetsov et al. |
| 9,826,614 | B1 | 11/2017 | Bakeman et al. |
| 9,885,962 | B2 | 2/2018 | Veldman et al. |
| 9,915,522 | B1 | 3/2018 | Jiang et al. |
| 10,013,518 | B2 | 7/2018 | Bakeman et al. |
| 10,101,670 | B2 | 10/2018 | Pandev et al. |
| 10,152,678 | B2 | 12/2018 | Pandev et al. |
| 10,324,050 | B2 | 6/2019 | Hench et al. |
| 10,352,695 | B2 | 7/2019 | Dziura et al. |
| 2003/0021465 | A1 | 1/2003 | Adel et al. |
| 2007/0176128 | A1 | 8/2007 | Van Bilsen et al. |
| 2007/0221842 | A1 | 9/2007 | Morokuma et al. |
| 2008/0147343 | A1 | 6/2008 | Good et al. |
| 2009/0152463 | A1 | 6/2009 | Toyoda et al. |
| 2011/0266440 | A1 | 11/2011 | Boughorbel et al. |
| 2012/0292502 | A1 | 11/2012 | Langer et al. |
| 2013/0208279 | A1 | 8/2013 | Smith |
| 2013/0304424 | A1 | 11/2013 | Bakeman et al. |
| 2014/0019097 | A1 | 1/2014 | Bakeman et al. |
| 2014/0064445 | A1 | 3/2014 | Adler |
| 2014/0111791 | A1 | 4/2014 | Manassen et al. |
| 2014/0172394 | A1 | 6/2014 | Kuznetsov et al. |
| 2014/0222380 | A1 | 8/2014 | Kuznetsov et al. |
| 2014/0297211 | A1 | 10/2014 | Pandev et al. |
| 2015/0046121 | A1 | 2/2015 | Dziura et al. |
| 2015/0110249 | A1 | 4/2015 | Bakeman et al. |
| 2015/0117610 | A1 | 4/2015 | Veldman et al. |
| 2015/0204664 | A1 | 7/2015 | Bringoltz et al. |
| 2015/0285749 | A1 | 10/2015 | Moncton et al. |
| 2015/0300965 | A1 | 10/2015 | Sezginer et al. |
| 2016/0202193 | A1 | 7/2016 | Hench et al. |
| 2016/0320319 | A1 | 11/2016 | Hench et al. |
| 2016/0334717 | A1 | 11/2016 | Wildenberg et al. |
| 2017/0167862 | A1 | 6/2017 | Dziura et al. |
| 2018/0106735 | A1 | 4/2018 | Gellineau et al. |
| 2018/0113084 | A1 | 4/2018 | Hench et al. |
| 2018/0328859 | A1 | 11/2018 | Osada et al. |
| 2018/0328868 | A1 | 11/2018 | Bykanov et al. |
| 2019/0017946 | A1 | 1/2019 | Wack et al. |
| 2019/0130551 | A1 | 5/2019 | Chen |
| 2019/0293578 | A1 | 9/2019 | Gellineau |

OTHER PUBLICATIONS

Lemaillet, Germer, Kline et al., "Intercomparison between optical and x-ray scatterometry measurements of FinFET structures" by Proc. SPIE, v.8681, p. 86810Q (2013).
Kline et al., "X-ray scattering critical dimensional metrology using a compact x-ray source for next generation semiconductor devices," J. Micro/Nanolith. MEMS MOEMS 16(1), 014001 (Jan.-Mar. 2017).
International Search Report mailed on Dec. 9, 2022, for PCT Application No. PCT/US2022/040674. Filed on Aug. 18, 2022 by KLA Corporation, 3 pages.

* cited by examiner

METHODS AND SYSTEMS FOR SELECTING WAFER LOCATIONS TO CHARACTERIZE CROSS-WAFER VARIATIONS BASED ON HIGH-THROUGHPUT MEASUREMENT SIGNALS

CROSS REFERENCE TO RELATED APPLICATION

The present application for patent claims priority under 35 U.S.C. § 119 from U.S. provisional patent application Ser. No. 63/236,797, filed Aug. 25, 2021, the subject matter of which is incorporated herein by reference in its entirety.

TECHNICAL FIELD

The described embodiments relate to metrology systems and methods, and more particularly to methods and systems for improved measurement of semiconductor structures.

BACKGROUND INFORMATION

Semiconductor devices such as logic and memory devices are typically fabricated by a sequence of processing steps applied to a specimen. The various features and multiple structural levels of the semiconductor devices are formed by these processing steps. For example, lithography among others is one semiconductor fabrication process that involves generating a pattern on a semiconductor wafer. Additional examples of semiconductor fabrication processes include, but are not limited to, chemical-mechanical polishing, etch, deposition, and ion implantation. Multiple semiconductor devices may be fabricated on a single semiconductor wafer and then separated into individual semiconductor devices.

Metrology processes are used at various steps during a semiconductor manufacturing process to detect defects on wafers to promote higher yield. Optical and X-ray based metrology techniques offer the potential for high throughput without the risk of sample destruction. A number of metrology based techniques including scatterometry, reflectometry, and ellipsometry implementations and associated analysis algorithms are commonly used to characterize critical dimensions, film thicknesses, composition, overlay and other parameters of nanoscale structures.

In some measurement applications, electron microscopy techniques (e.g., scanning electron microscopy (SEM), transmission electron microscopy (TEM)) are employed to characterize process variation across a wafer. In general, semiconductor fabrication processes are not executed in a perfectly homogeneous manner across a wafer under process due to intrinsic variation in process tools. Although electron microscopy measurements offer unique insights into process variation, they are extremely slow. In a modern productive semiconductor manufacturing facility, the number of measurement sites selected for electron microscopy measurements must be limited to maintain cost and throughput goals.

In other measurement applications, machine-learning based models of critical dimension (CD) across a wafer are developed to predict critical dimensions based on a relatively small number of measurements. In some of these applications, a machine-learning based model is trained based in part on CD measurements performed by an electron microscope at selected die locations. Again, cost and throughput considerations limit the number of die locations selected for measurement to generate model training data.

Several approaches have been employed to select representative die locations for time consuming measurements employed to characterize process variation, machine learning based measurement model training, or other measurement applications.

In some examples, measurement sites are selected uniformly across a wafer surface. In some examples, die locations are uniformly selected based on their radial position on the wafer (e.g., (0,0), (1,1), (2,2), etc.). In some examples, die locations are selected simply based on their relative location on the wafer (e.g., die locations at center of wafer, middle of wafer, edge of wafer, etc.).

In some other examples, measurement sites are selected based on heuristic rules derived from empirical knowledge of the variation of the fabrication process on a wafer. However, selection of measurement sites based on geometric location or heuristic rules often fails to effectively characterize the process variation across a wafer. The selected measurement sites may misrepresent process variation across the wafer or introduce undesirable bias into model training.

In some examples, the distribution of actual CD measurements performed by an optical critical dimension (OCD) measurement system is employed to select measurement sites for measurements employed to characterize cross-wafer process variation, train machine-learning based measurement models applicable at any wafer location, etc. However, this approach requires building and verifying OCD measurement models, which requires significant time and effort, and despite best efforts, the accuracy of the OCD measurement models may not be sufficient to identify suitable measurement sites.

Future metrology applications present challenges for metrology due to increasingly small resolution requirements, multi-parameter correlation, increasingly complex geometric structures, and increasing use of opaque materials. Methods and systems for selection of measurement sites for detailed measurements employed to characterize the entire wafer are desired.

SUMMARY

Methods and systems for selecting measurement locations on a wafer for subsequent detailed measurements employed to characterize the entire wafer are described herein.

High throughput measurements are performed at a relatively large number of measurement sites on a wafer (e.g., measurements at each die location).

In one aspect, the measurement signals are transformed to a new mathematical basis and reduced to a significantly smaller dimension in the new basis. In this manner, subsequent data analysis is performed based on a much smaller data set to efficiently arrive at the selected measurement sites.

In another aspect, a set of representative measurement sites (e.g., die locations) is selected based on analyzing variation of the high throughput measurement signals. In some embodiments, the analysis of signal variation is achieved using machine-learning based techniques. In this manner, the selected measurement sites (e.g., die locations) effectively represent process variation across the measured wafer. In some embodiments, the spectra are subdivided into a set of different groups. The spectra are grouped together to minimize variance within each group. Furthermore, a die location is selected that is representative of the variance exhibited by the die in each group.

In another aspect, a spectrum of a measurement site is selected to correspond most closely to the center point of each cluster. Thus a set of physical locations on the wafer is selected corresponding to the selected spectra.

In some embodiments, electron microscopic measurements (e.g., SEM, TEM, etc.) of one or more critical dimensions are performed at the selected measurement sites, and the electron microscopic measurements are employed to characterize process variation across the measured wafer.

In a further aspect, regularization of an optimization employed to select measurement sites is implemented with respect to die location to ensure uniform spatial distribution of the selected die locations across a wafer. In some embodiments, additional regularization terms are appended to the vector of principal components associated with each spectrum to drive subsequent analysis to select die locations that are spaced apart on the wafer. More specifically, the coordinates of the die location associated with each spectrum is included as an additional regularization term in the vector of measurement data associated with each spectrum.

In another further aspect, measurement outliers are identified and eliminated before signal transformation, after signal transformation, or both. In this manner, the impact of process anomalies on the selection of measurement sites is minimized. In this manner, the selected measurement sites are robust to process anomalies.

The foregoing is a summary and thus contains, by necessity, simplifications, generalizations and omissions of detail; consequently, those skilled in the art will appreciate that the summary is illustrative only and is not limiting in any way. Other aspects, inventive features, and advantages of the devices and/or processes described herein will become apparent in the non-limiting detailed description set forth herein.

DETAILED DESCRIPTION

Reference will now be made in detail to background examples and some embodiments of the invention, examples of which are illustrated in the accompanying drawings.

Methods and systems for selecting measurement locations on a wafer for detailed measurements employed to characterize the entire wafer are described herein. High throughput measurements are performed at a relatively large number of measurement sites on a wafer (e.g., measurements at each die location). A set of representative measurement sites (e.g., die locations) is selected based on analyzing variation of the high throughput measurement signals. In some embodiments, the analysis of signal variation is achieved using machine-learning based techniques. In this manner, the selected measurement sites (e.g., die locations) effectively represent process variation across the measured wafer. In some embodiments, electron microscopic measurements (e.g., SEM, TEM, etc.) of one or more critical dimensions are performed at the selected measurement sites, and the electron microscopic measurements are employed to characterize process variation across the measured wafer.

High throughput measurement signals performed at a relatively large number of measurement sites are mathematically transformed to an alternative basis to reduce the dimension of the measurement data to minimize computational effort. In this manner, subsequent data analysis is performed based on a much smaller data set to efficiently arrive at the selected measurement sites.

In some embodiments, regularization of an optimization employed to select measurement sites is implemented with respect to die location to ensure uniform spatial distribution of the selected die locations across a wafer.

In some embodiments, measurement outliers are identified and eliminated before signal transformation, after signal transformation, or both. In this manner, the impact of process anomalies on the selection of measurement sites is minimized. In this manner, the selected measurement sites are robust to process anomalies.

Figure 1:
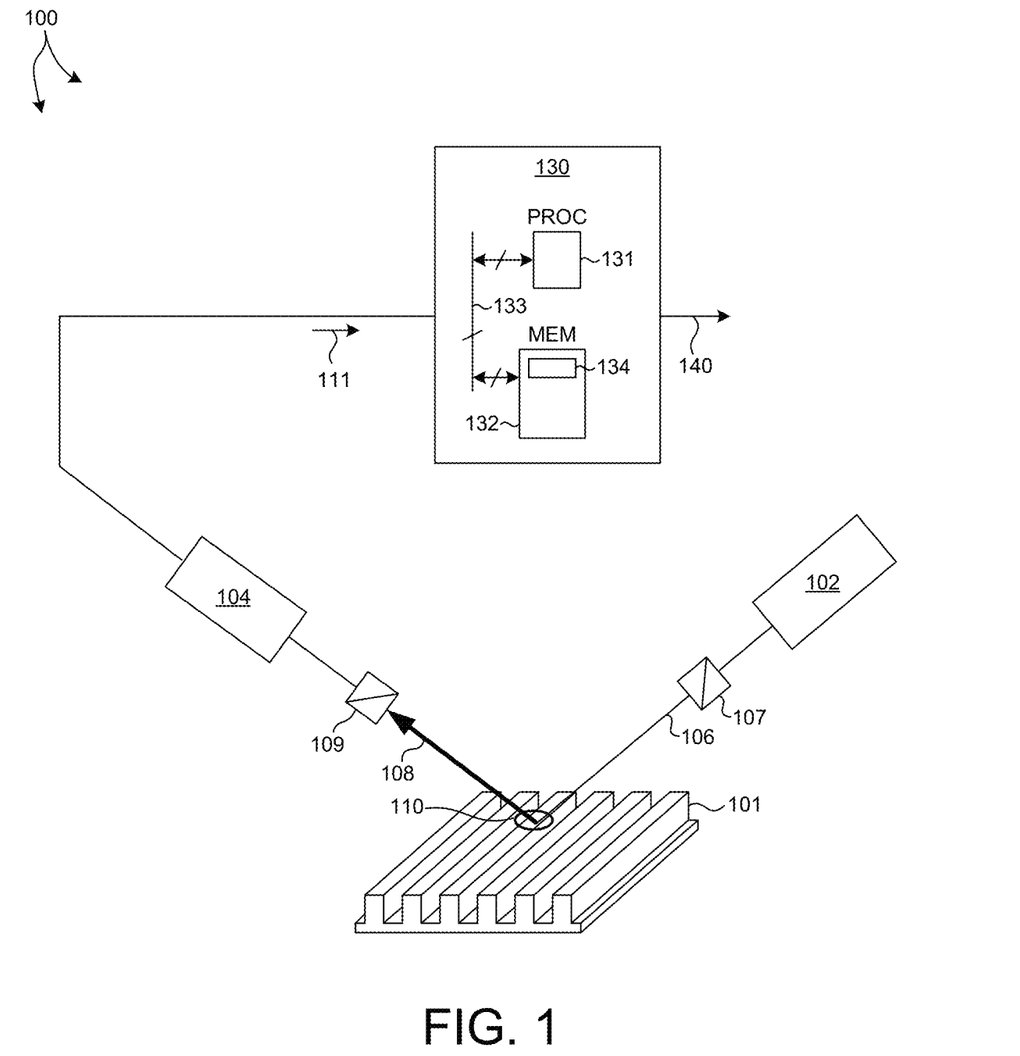
FIG. 1 depicts an illustration of a wafer metrology system 100 for measuring characteristics of a wafer in accordance with the exemplary methods presented herein.

FIG. 1 illustrates a high throughput measurement system 100 for measuring characteristics of a specimen in accordance with the exemplary methods presented herein. As shown in FIG. 1, the system 100 may be used to perform spectroscopic ellipsometry measurements of structure 101 depicted in FIG. 1. In this aspect, the system 100 may include a spectroscopic ellipsometer equipped with an illuminator 102 and a spectrometer 104. The illuminator 102 of the system 100 is configured to generate and direct illumination of a selected wavelength range (e.g., 100-2500 nm) to the structure disposed on the surface of the specimen over a measurement spot 110. In turn, the spectrometer 104 is configured to receive illumination reflected from structure 101. It is further noted that the light emerging from the illuminator 102 is polarized using a polarization state generator 107 to produce a polarized illumination beam 106. The radiation reflected by structure 101 is passed through a polarization state analyzer 109 and to the spectrometer 104. The radiation received by the spectrometer 104 in the collection beam 108 is analyzed with regard to polarization state, allowing for spectral analysis by the spectrometer of radiation passed by the analyzer. These spectra 111 are passed to the computing system 130 for analysis of the structure as described herein.

As depicted in FIG. 1, system 100 includes a single measurement technology (i.e., spectroscopic ellipsometer (SE)). However, in general, system 100 may include any number of different measurement technologies. By way of non-limiting example, system 100 may be configured as a spectroscopic ellipsometer (including Mueller matrix ellipsometry), a spectroscopic reflectometer, a spectroscopic scatterometer, an overlay scatterometer, an angular resolved beam profile reflectometer, a polarization resolved beam profile reflectometer, a beam profile reflectometer, a beam profile ellipsometer, any single or multiple wavelength ellipsometer, or any combination thereof. Furthermore, in general, measurement data collected by different measurement technologies and analyzed in accordance with the methods described herein may be collected from multiple tools, a single tool integrating multiple technologies, or a combination thereof, including, by way of non-limiting example, soft X-ray reflectometry, small angle x-ray scatterometry, an imaging based metrology system, a hyperspectral imaging based metrology system, a scatterometry overlay metrology system, etc.

In a further embodiment, system 100 may include one or more computing systems 130 employed to perform measurements of structures based on measurement models developed in accordance with the methods described herein. The one or more computing systems 130 may be communicatively coupled to the spectrometer 104. In one aspect, the one or more computing systems 130 are configured to receive measurement data 111 associated with measurements of a structure under measurement (e.g., structure 101) and generate a set of selected measurement sites 140 for further measurement by a relatively slow measurement technique (e.g., electron microscopy).

Figure 2:
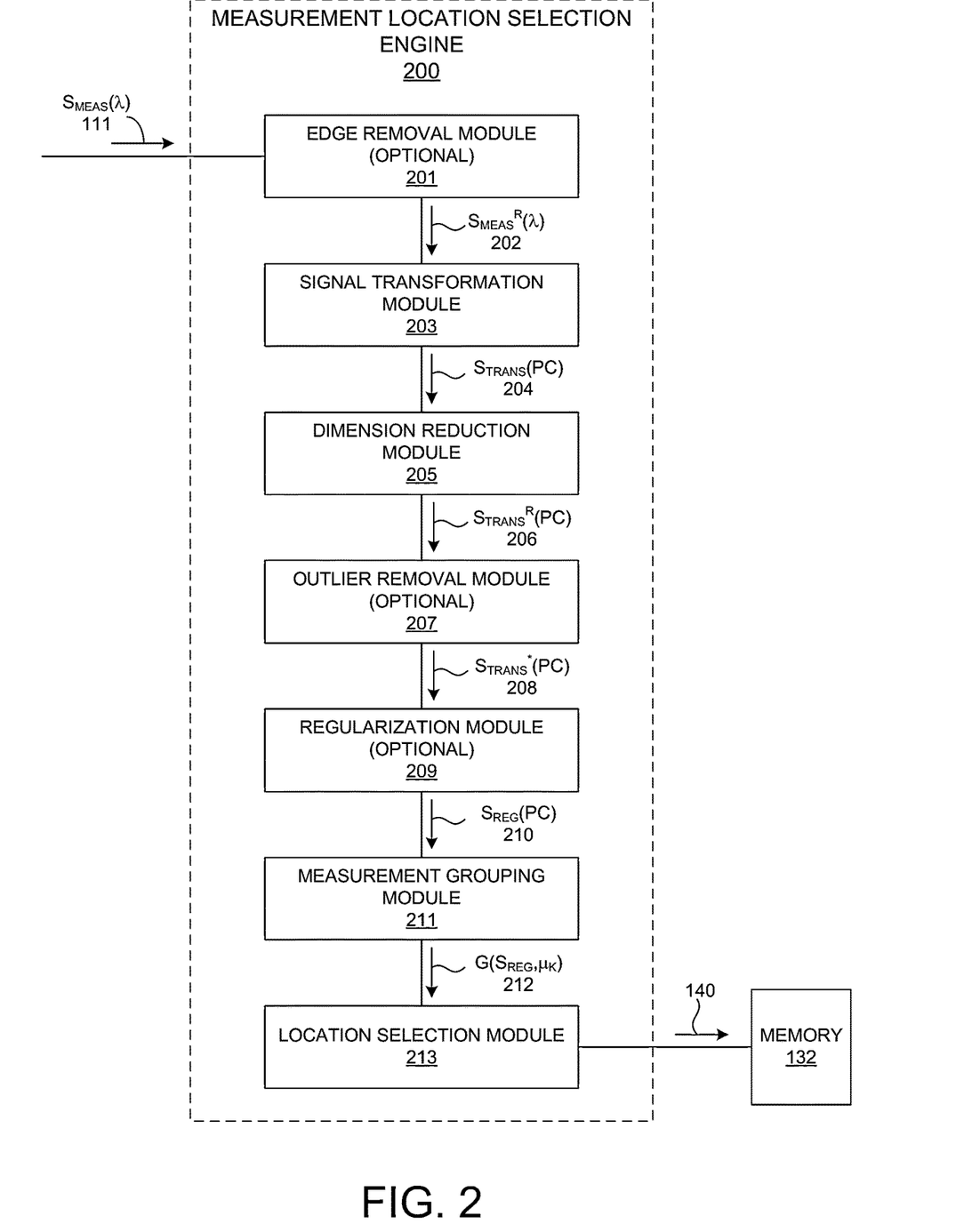
FIG. 2 is a diagram illustrative of an exemplary measurement location selection engine 200 in one embodiment.

In one aspect, computing system 130 is configured as a measurement location selection engine 200 to select measurement locations based on analysis of high throughput measurement data collected from a relatively large number of measurement sites on a wafer as described herein.

FIG. 2 is a diagram illustrative of an exemplary measurement location selection engine 200 in one embodiment.

As depicted in FIG. 2, measurement location selection engine 200 receives measurement data, $S_{MEAS}$ 111, associated with actual measurements of a relatively large number of measurement sites on a wafer (i.e., significantly more measurement sites than the number of measurement sites ultimately selected for low throughput measurement). In some embodiments, measurements are performed at each die location on a wafer. In an example of a spectroscopic ellipsometer measurement, the measurement data set includes i measured spectra, i.e., measured intensity, I, at a number of different wavelengths as illustrated in equation (1), where, D, is the number of measured wavelengths and, i, is the number of measured spectra.

$$S_{MEAS}(\lambda)_i = \begin{bmatrix} I_1 \\ I_2 \\ \vdots \\ I_D \end{bmatrix}_i \quad (1)$$

In one example, the measurement data 111 includes measured spectra 111 collected by metrology system 100 from different die locations on a wafer. However, in general, measurement signals provided to measurement location selection engine 200 may include measurement signals collected by one or more different metrology tools. In some examples, measurement signals may be collected by any of a spectroscopic ellipsometer, spectroscopic reflectometer, scatterometer, a Fourier Transform Infrared Reflectometer (FTIR), a Critical Dimension Small Angle X-Ray Scatterometer (CDSAXS), etc.).

Figure 3:
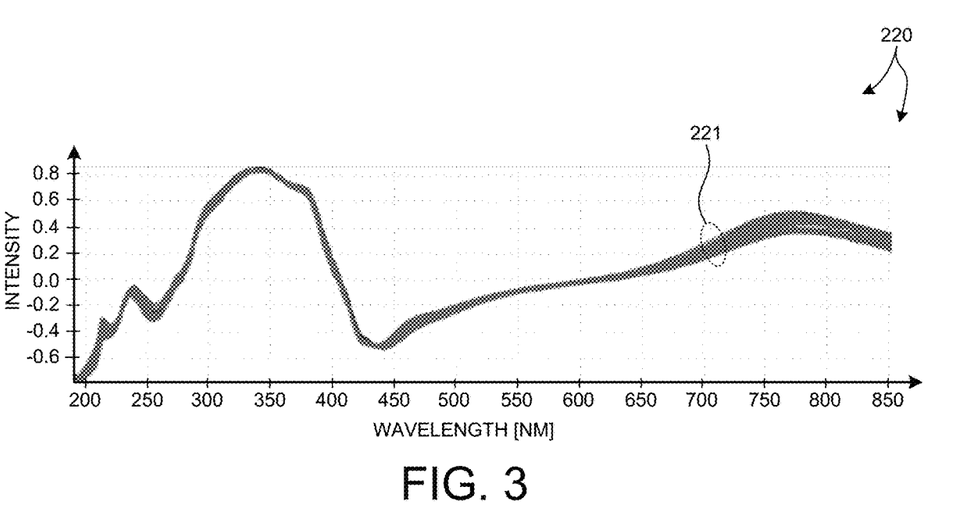
FIG. 3 depicts a plot 220 illustrative of a number of measured spectra.
Figure 4:
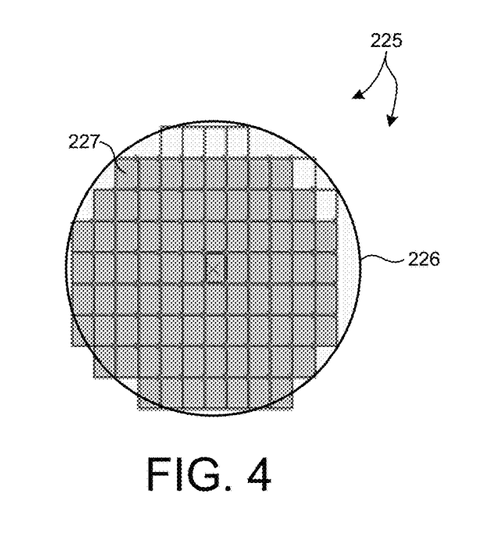
FIG. 4 depicts a diagram illustrative of the die locations on a wafer associated with each of the measured spectra depicted in FIG. 3.

FIG. 3 depicts a plot 220 illustrative of eighty three measured spectra 221. FIG. 4 depicts a diagram 225 illustrative of the die locations on wafer 226 associated with each of the measured spectra depicted in FIG. 3. As depicted in FIG. 4, the measured die locations are shaded in grey, e.g., measured die location 227.

In a further aspect, measurement signals associated with die that are particularly prone to process anomaly due to their location on the wafer surface are removed before data transformation.

As depicted in FIG. 2, measurement signals 111 are communicated to edge removal module 201. Edge removal module 201 removes measurement signals associated with suspect die locations from the data set and communicates a reduced set of measurement signals, $S_{MEAS}^R(\lambda)$ 202, to signal transformation module 203. In some embodiments, measurements associated with die locations near the edge of a wafer are removed from the data set. Process anomalies are known to occur around the wafer edge. To prevent these anomalies from corrupting the data set, the measurement signals associated with the edge die locations are removed. In some embodiments, measurement signals associated with die locations having a radial location beyond a pre-determined threshold value are removed from the data set. In one example, measurement signals associated with die locations having a radial location less than 80% of the wafer radius are retained, and measurement signals associated with die locations having a radial location greater than 80% of the wafer radius are removed.

Figure 5:
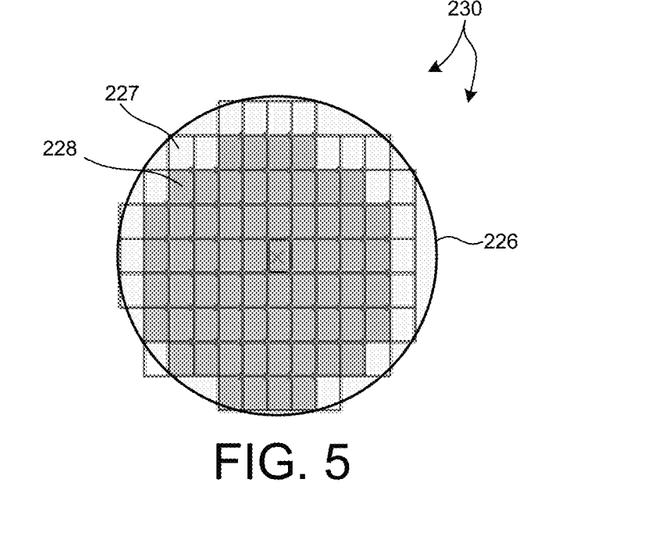
FIG. 5 depicts a diagram illustrative of the die locations depicted in FIG. 4. Shaded die locations are retained and unshaded die locations are removed from the data set.

FIG. 5 depicts a diagram illustrative of the die locations on wafer 226 associated with each of the measured spectra depicted in FIG. 3. As depicted in FIG. 5, measurement signals associated with die locations shaded in grey, e.g., measured die location 228, are retained, and measurement signals associated with unshaded die locations, e.g., measured die location 227, are removed from the data set. In the example depicted in FIG. 5, measurement signals associated with die locations having a radial location less than 80% of the wafer radius (120 millimeters) are retained, and measurement signals associated with die locations having a radial location greater than 80% of the wafer radius (120 millimeters) are removed.

In general, suspect die locations may be identified in any suitable manner, such as an automated manner as described herein, or manually.

Although, measurement location selection engine 200 includes an edge removal module 201 to remove measurement signals associated with suspect die locations, in general, removal of measurement signals due to suspected process anomalies is optional. Thus, edge removal module 201 as an element of measurement location selection engine 200 is optional.

In a further aspect, the measurement signals are transformed to a new mathematical basis and reduced to a significantly smaller dimension in the new basis.

As depicted in FIG. 2, reduced measurement signals 202 are communicated to signal transformation module 203. Signal transformation module 203 mathematically transforms the spectral measurement data to a new basis. In some embodiments, Principal Component Analysis (PCA) is applied to the spectral measurement data to transform the data set basis from wavelengths to principal components (PC), $S_{TRANS}(PC)$ as illustrated in Equation (2). As illustrated in Equation (2), the spectral data set is now expressed in terms of weighting values associated with a number of PC, where, M, is the number of PC.

$$S_{TRANS}(PC)_i = \begin{bmatrix} PC_1 \\ PC_2 \\ \vdots \\ PC_m \end{bmatrix}_i \quad (2)$$

As depicted in FIG. 2, the transformed data set, $S_{TRANS}$ (PC) 204, is communicated to dimension reduction module 205. Dimension reduction module 205 reduces the dimension of the data set by removing components having the smallest contribution to total variance of the data set and retaining the components having the largest. PCA ranks the PC according to their relative contribution to the variance of the complete data set. Thus, dimension reduction module 205 selects a number of the PC having the largest contribution to total variance of the data set. In some examples, dimension reduction module 205 selects the N components having the largest contributions where N is just large enough to account for 95% of the variance of the complete data set. In general, the number of selected PC, N, is configurable according to requirements on sensitivity. In some examples, the default value of N is three.

Figure 6:
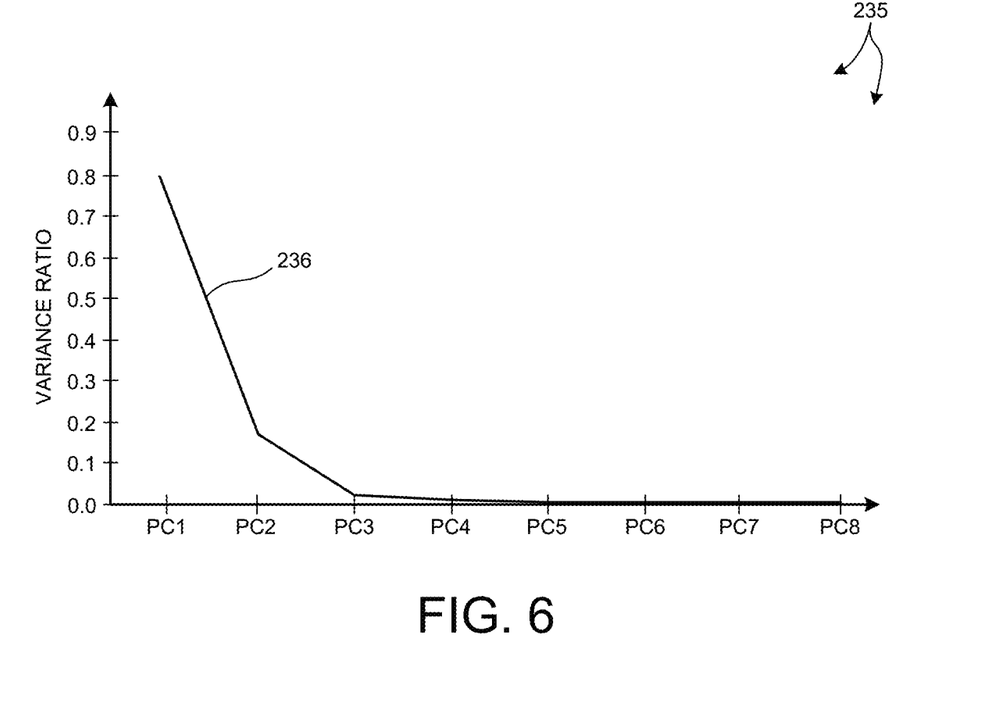
FIG. 6 depicts a plot illustrating the variance ratio of the eight principal components having the largest contribution to variance of the complete data set.

FIG. 6 depicts a plot 235 illustrating the variance ratio of the eight PC having the largest contribution to variance of the complete data set. The variance ratio is the variance of the PC divided by the variance of the complete data set. As illustrated in FIG. 6, the variance of the first PC (PC1) is 80% of the variance of the complete data set. In other words, a single PC, PC1, accounts for 80% of the variance of all of the spectral measurements. Also, as depicted in FIG. 6, the first eight PC, PC1-PC8, account for more than 95% of the variance of the complete data set.

In one example, dimension reduction module 205, selects the first three PC, PC1-PC3, to represent the complete data set, and removes all of the other PC to generate a reduced, transformed data set, $S_{TRANS}^R(PC)$ 206. $S_{TRANS}^R(PC)$ 206 as illustrated in Equation (3) is communicated to outlier removal module 207.

$$S_{TRANS}^R(PC)_i = \begin{bmatrix} PC_1 \\ PC_2 \\ PC_3 \end{bmatrix}_i \quad (3)$$

In general, any suitable mathematical method for decomposing multivariate signals into additive subcomponents is contemplated herein to reduce the dimensionality of measurement signals from one or more, high throughput metrology tools. By way of non-limiting example, any of PCA, kernel PCA, Canonical Correlation Analysis (CCA), Independent Component Analysis (ICA), factor analysis, etc., are within the scope of this patent document.

In another further aspect, measurement signals associated with die that exhibit abnormality due to process anomaly are identified and removed after data transformation.

As depicted in FIG. 2, outlier removal module 207 receives reduced, transformed data set, $S_{TRANS}^R(PC)$ 206. In some embodiments, outlier removal module 207 ensures that a sufficient number of spectra are included in the outlier analysis, or the outlier analysis is skipped due to excessively sparse sampling. For example, outlier removal module 207 determines if the number of spectra, i, under consideration is less than a predetermined threshold value, T. If i is less than T, the outlier analysis is not performed. However, if i is greater than or equal to T, the outlier analysis is performed. In some examples, T is an integer value of ten, or larger.

Outlier removal module 207 determines a modified Z-score associated with each spectrum and each principal component as illustrated in Equation (4), $$M_{i,j} = \frac{\text{abs}(x_{i,j} - \tilde{x}_j)}{k * MAD_j} \quad (4)$$

where x is $S_{TRANS}^R(PC)$, i is the ith spectrum, j is the jth PC, $\tilde{x}_j$ is the median of the jth PC across all of the spectra, k is a constant having a value of 1.4826, and $MAD_j$ is the median absolute deviation associated with the jth PC across all spectra as illustrated in Equation (5), $$MAD_j = \text{median}(\text{abs}(x_{i,j} - \tilde{x}_j)) \quad (5)$$

Outlier removal module 207 determines the modified Z-score having the maximum value for each measured spectrum as illustrated in Equation (6), $$M_{i,max} = \max(M_{i,1}, M_{i,2}, \ldots, M_{i,N}) \quad (6)$$

where $M_{i,N}$ is the modified Z-score of the Nth component and ith spectra.

The modified Z-score of a point describes the number of standard deviations from the median of a normal distribution. Outlier removal module 207 compares the maximum value of the modified Z-score associated with each spectrum with a predetermined threshold value, $T_{score}$. In this manner, the value of $T_{score}$ sets the threshold for the tolerable number of standard deviations from the median of the modified Z-score associated with each spectrum. If the maximum value of the modified Z-score associated with a spectrum is below $T_{score}$, the spectrum remains part of the data set. However, if the maximum value of the modified Z-score associated with each spectrum is above $T_{score}$, the spectrum is removed from the data set. In this manner, outlier removal module 207 filters out spectra having a modified Z-score that is several standard deviations from the median modified Z-score. In some examples, the default value of $T_{score}$ is 10 or larger. Outlier removal module 207 communicates filtered, reduced, transformed data set, $S_{TRANS}^*(PC)$ 208 to regularization module 209.

Figure 7:
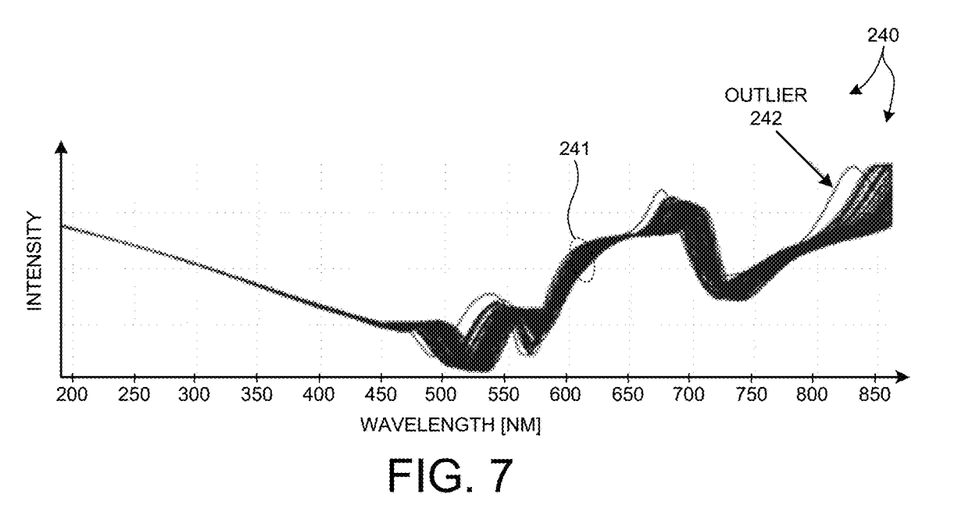
FIG. 7 depicts a plot illustrative of a large number of measured spectra including an outlier spectrum.

FIG. 7 depicts a plot 240 illustrative of a large number of measured spectra 241 including an outlier spectrum 242.

Although, measurement location selection engine 200 includes an outlier removal module 207 to remove measurement signals associated with suspect die locations, in general, removal of measurement signals due to suspected process anomalies is optional. Thus, outlier removal module 207 as an element of measurement location selection engine 200 is optional.

In many measurement applications, it is not feasible to measure adjacent die on a wafer using electron microscopy techniques. Often, the required sample preparation, the energy imparted to the wafer by the measurement itself, or both, will distort die adjacent to the die under measurement.

In another aspect, additional regularization terms are appended to the vector of PC associated with each spectrum to drive subsequent analysis to select die locations that are spaced apart on the wafer. More specifically, the coordinates of the die location associated with each spectrum is included as an additional regularization term in the vector of measurement data associated with each spectrum.

As depicted in FIG. 2, regularization module 209 receives filtered, reduced, transformed data set, $S_{TRANS}^*(PC)$ 208 from outlier removal module 207. Regularization module 209 appends each spectrum with two additional terms, $PC_x$ and $PC_y$ as illustrated by Equations (7) and (8), $$PC_x = x * w * \sqrt{\frac{var_1}{var_x}} \quad (7)$$

$$PC_y = y * w * \sqrt{\frac{var_1}{var_y}} \quad (8)$$

where x and y are the x-coordinate and the y-coordinate, respectively, of the die location associated with each respective spectrum, w is a weighting constant, $var_1$ is the variance of $PC_1$ across all die locations, $var_x$ is the variance of x across all die locations, and $var_y$ is the variance of y across all die locations.

$$\sqrt{\frac{var_1}{var_x}}$$

is a scaling factor to make the variance of $PC_x$ comparable to $PC_1$.

$$\sqrt{\frac{var_1}{var_y}}$$

is a scaling factor to make the variance of $PC_y$ comparable to $PC_1$.

The value of weighting constant, w, depends on the uniformity level desired. A larger value of w increases the uniformity level by increasing the variance of $PC_x$ and $PC_y$. This drives the optimization algorithm to recommend die locations that are more uniformly distributed on a wafer.

Regularization module 209 appends filtered, reduced, transformed data set, $S_{TRANS}*(PC)$ 208 with the regularization terms to generate a regularized data set, $S_{REG}(PC)$ 210, and communicates $S_{REG}(PC)$ 210 to measurement grouping module 211. An element of the regularized data set, $S_{REG}(PC)$ 210, is illustrated by Equation (9).

$$S_{REG}(PC)_i = \begin{bmatrix} PC_1 \\ PC_2 \\ PC_3 \\ PC_x \\ PC_y \end{bmatrix}_i \quad (9)$$

Figure 9:
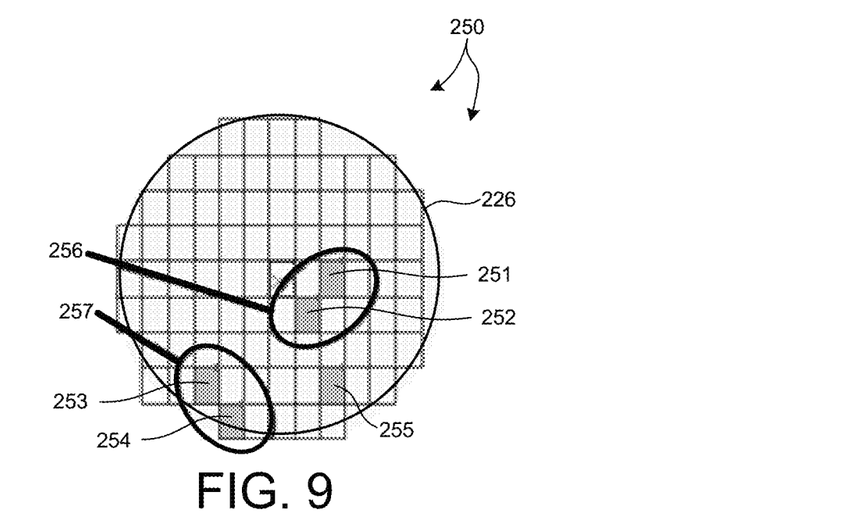
FIG. 9 depicts a diagram illustrative of selected die locations on a wafer without regularization.

FIG. 9 is a diagram 250 illustrative of selected die locations on a wafer without regularization. As depicted in FIG. 9, the shaded die locations (i.e., die locations 251-255) on wafer 226 are selected for further measurement. The unshaded die locations are not selected. Reference oval 256 highlights die locations 251 and 252 as selected die that are adjacent to one another. Similarly, reference oval 257 highlights die locations 253 and 254 as selected die that are adjacent to one another. This die selection is impractical to implement as measurements of any one die of the adjacent pairs would distort the other die.

Figure 10:
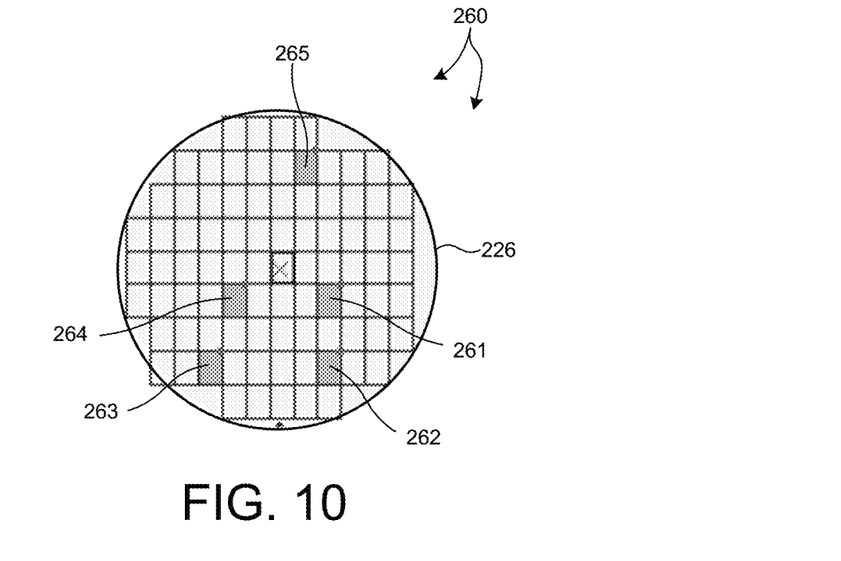
FIG. 10 depicts a diagram illustrative of the die locations corresponding to the selected spectra illustrated in FIG. 8.

FIG. 10 is a diagram 260 illustrative of selected die locations on a wafer with regularization. As depicted in FIG. 10, the shaded die locations (i.e., die locations 261-265) on wafer 226 are selected for further measurement. The unshaded die locations are not selected. None of the selected die is adjacent to another selected die. In fact, the selected dies are spatially distributed across the surface of the wafer in a fairly uniform manner. This die selection is practical to implement as measurements of any one of the selected die will not distort any of the other selected die.

Although, measurement location selection engine 200 includes a regularization module 209 to enhance the spatial distribution of selected die locations across the wafer, in general, the regularization is optional. Thus, regularization module 209 as an element of measurement location selection engine 200 is optional.

In another aspect, the spectra are subdivided into a set of different groups. The spectra are grouped together to minimize variance within each group. Furthermore, a die location is selected that is representative of the variance exhibited by the die in each group.

In general, the grouping of measurement signals on a wafer is performed by either an unsupervised technique (e.g., clustering analysis) or a supervised technique (e.g., classification analysis). In general, any suitable clustering analysis technique is contemplated within the scope of this patent document. By way of non-limiting example, measurement signals may be grouped by any of connectivity-based clustering, centroid-based clustering, distribution-based clustering, density-based clustering, and grid-based clustering.

As depicted in FIG. 2, measurement grouping module 211 receives the regularized data set, $S_{REG}(PC)$ 210 from regularization module 209. In some embodiments, measurement grouping module 211 groups spectra into clusters using a K-means algorithm. The K-means algorithm minimizes within-cluster variance, and thus maximizes between-cluster variance.

Measurement grouping module 211 groups measurement sites into a predetermined number of clusters, k, provided as input by a user. Measurement grouping module 211 determines the center of each initial cluster by one or several different methods. In general, any suitable technique for seeding the K-means clusters is contemplated within the scope of this patent document. In some embodiments, the center of each initial cluster is selected randomly over the wafer area. In some other embodiments, a K-means++ algorithm is implemented to determine the center of each initial cluster. In these embodiments, one center is selected at random among the data points. For each unselected data point, the distance, $D(x)$, between the unselected data point and the nearest selected data point is determined. An additional, new data point is selected at random as a center point using a weighted probability distribution where a point is chosen with probability proportional to $D(x)^2$. The distance calculations and selection of additional, new center points continues iteratively until k centers have been chosen.

After determining the center of each initial cluster, measurement grouping module 211 determines the distance from each data point to each of the center points. Each data point is reassigned to the cluster corresponding to the center with the minimum distance between the center and the data point.

After clustering the data points around the initial set of center points, measurement grouping module 211 determines a new location of the center points associated with each cluster. The new center point locations are determined by minimizing a normalized inertia, which is the squared sum of the distance from each data point to the center point closest to it as illustrated by Equation (10), $$\text{Inertia}_{normalized} = \frac{\text{Inertia}}{\text{Inertia}_0} = \frac{\sum_{i=1}^{n'} \min_{\mu_k \in C}(\|x_i - \mu_k\|^2)}{\sum_{i=1}^{n'} \|x_i - \mu\|^2} \quad (10)$$

where $\mu_k$ is a center point belonging to the set of all center points, C, and $x_i$ refers to each spectrum. K-means clustering groups spectra data into clusters with minimum inertia as illustrated in the numerator of Equation (10). However, the absolute value of inertia is not meaningful because it is not comparable for different conditions. To make it meaningful, inertia is normalized by dividing the inertia by baseline inertia, $Inertia_0$. $Inertia_0$ is the inertia with a single cluster. Since $Inertia_{normalized}$ is dimensionless, the values compare more generally despite differences in spectra signal, spectra number, etc.

Measurement grouping module 211 iteratively reassigns data points to different clusters and recalculates the position of the center point of each cluster until there are no data points reassigned to a new cluster. The resulting grouping, $G(S_{REG}, \mu_k)$ 212 is communicated to location selection module 213. Grouping, G, includes the set of k center points, $\mu_k$, and the regularized data set, $S_{REG}$, including an indication of which spectra are associated with each center point.

Each point in the regularized data set, $S_{REG}$, corresponds to a specific measurement site (e.g., die location) on the measured wafer. However, the center points, $\mu_k$, are mathematically determined by measurement grouping module 211 to minimize inertia within each cluster, and the center points do not correspond directly to spectra of measurement sites.

In a further aspect, a spectrum of measurement sites is selected to correspond most closely to the center point of each cluster. Thus a set of physical locations on the wafer is selected corresponding to the selected spectra.

As depicted in FIG. 2, location selection module 213 determines a distance between each point of the regularized data set corresponding to a particular cluster and the center point of that cluster. The point of the regularized data set having the shortest distance to the center point of the cluster is selected as a die location for further measurements (e.g., electron microscopy based measurements). In a preferred embodiment, distance is measured as the Euclidean distance between each point of the regularized data set and the corresponding center point. However, in general, any suitable mathematical measure of distance may be employed to characterize the distance between each point in the regularized data set and the corresponding data point.

The set of die locations 140 selected for further measurement are stored in memory (e.g., memory 132).

Figure 8:
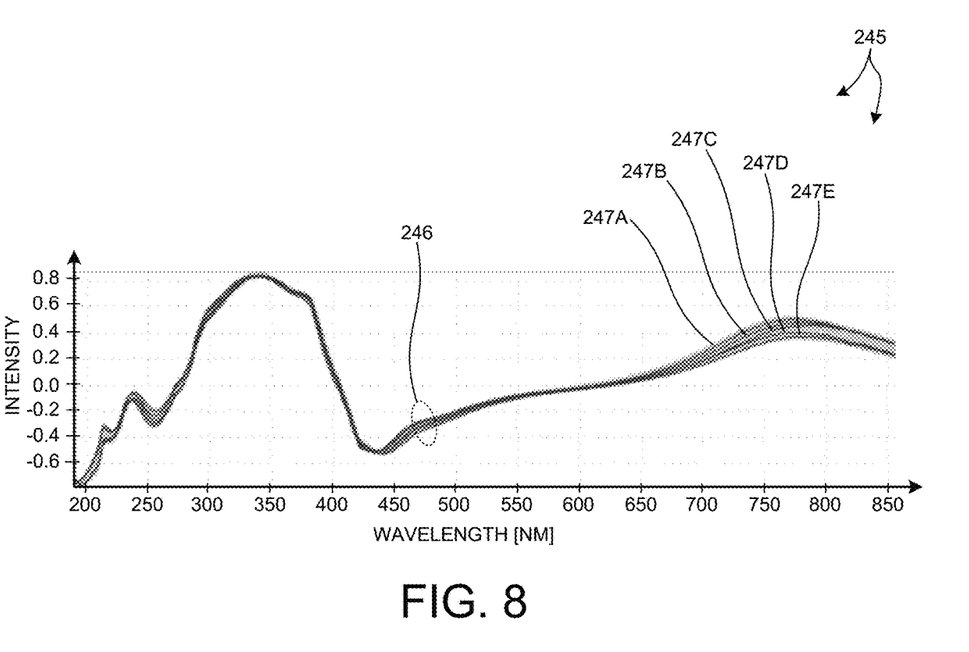
FIG. 8 depicts a plot illustrative of measured spectra, and spectra associated with die locations selected for further measurement as described herein.

FIG. 8 depicts a plot 245 illustrative of measured spectra 246, and spectra associated with die locations selected for further measurement as described herein. As illustrated in FIG. 8, spectra 247A-E corresponds to measurements of five different die locations on the measured wafer. FIG. 10 depicts the die locations 261-264 corresponding to spectra 247A-E, respectively.

An implementation of this approach is demonstrated based on, but not limited to, measurements from SE tools. Its generalization to other metrology tools is straight-forward by replacing SE signals with signals from a different metrology tool.

The flow chart of the algorithm is depicted in FIG. 2. It is demonstrated based on, but not limited to, signals collected from SE tools on a wafer. It can be generalized straight-forwardly to other metrology tools by replacing SE spectra with signals measured from one or more different metrology tools.

By way of non-limiting example, signals collected and processed in accordance with the methods described herein may include signals collected from a stand-alone optical metrology system, such as a SE, SE with multiple angles of illumination, SE measuring Mueller matrix elements, a single-wavelength ellipsometer, a beam profile ellipsometer, a beam profile reflectometer, a broadband reflective spectrometer, a single-wavelength reflectometer, an angle-resolved reflectometer, an imaging system, a scatterometer, such as a speckle analyzer, an X-ray based metrology system such as a small angle x-ray scatterometer (SAXS) operated in a transmission or grazing incidence mode, an x-ray diffraction (XRD) system, an x-ray fluorescence (XRF) system, an x-ray photoelectron spectroscopy (XPS) system, an x-ray reflectometer (XRR) system, a Raman spectroscopy system, a soft X-ray reflectometry system, an imaging based metrology system, a hyperspectral imaging based metrology system, a scatterometry overlay metrology system, or other technologies capable of determining device geometry.

The measurement sites selected in accordance with the methods described herein may be measured, subsequently, by any number of different metrology systems to arrive at a more detailed characterization of the wafer. Such metrology systems are typically lower throughput than the relatively high throughput metrology tools employed to measure the measurement sites analyzed by the methods described herein, and in some cases are destructive to the structures under measurement. By way of non-limiting example, metrology systems employed to measure a wafer at the selected measurement sites include an atomic force microscopy (AFM) system, a transmission electron microscopy system, a scanning electron microscopy system, etc.

In yet another further aspect, the measurement results described herein can be used to provide active feedback to a process tool (e.g., lithography tool, etch tool, deposition tool, etc.). For example, values of measured parameters determined based on measurement methods described herein can be communicated to an etch tool to adjust the etch time to achieve a desired etch depth. In a similar way etch parameters (e.g., etch time, diffusivity, etc.) or deposition parameters (e.g., time, concentration, etc.) may be included in a measurement model to provide active feedback to etch tools or deposition tools, respectively. In some example, corrections to process parameters determined based on measured device parameter values and a trained measurement model may be communicated to the process tool. In one embodiment, computing system 130 determines values of one or more parameters of interest during process based on measured signals 111 received from a measurement system. In addition, computing system 130 communicates control commands to a process controller (not shown) based on the determined values of the one or more parameters of interest. The control commands cause the process controller to change the state of a process (e.g., stop the etch process, change the diffusivity, change lithography focus, change lithography dosage, etc.).

In some embodiments, the methods and systems for metrology of semiconductor devices as described herein are applied to the measurement of memory structures. These embodiments enable CD, film, and composition metrology for periodic and planar structures.

In some examples, the measurement location selection engine described herein is implemented as an element of a SpectraShape® OCD metrology system available from KLA-Tencor Corporation, Milpitas, California, USA. In this manner, the measurement sites are selected and ready for use immediately after the spectra are collected by the system.

In some other examples, the measurement location selection process described herein is implemented off-line, for example, by a computing system implementing AcuShape® software available from KLA-Tencor Corporation, Milpitas, California, USA. The measurement location selection engine may be incorporated as an element of an AcuShape® library that is accessible by a metrology system performing measurements.

Figure 11:
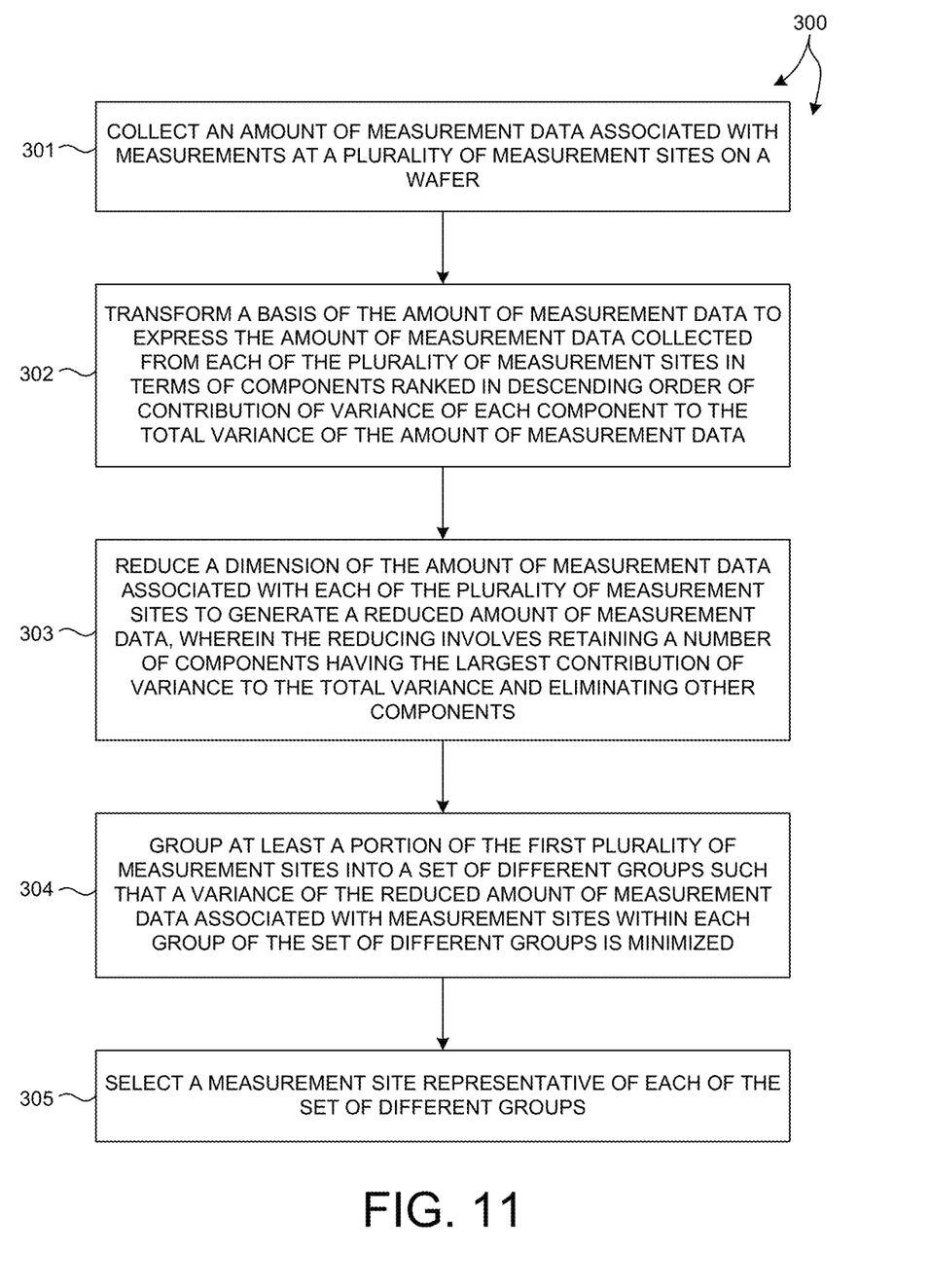
FIG. 11 is a flowchart illustrative of a method for selecting measurement locations on a wafer for subsequent detailed measurements employed to characterize the entire wafer in at least one novel aspect.

FIG. 11 illustrates a method 300 of selecting measurement locations on a wafer for subsequent detailed measurements employed to characterize the entire wafer in at least one novel aspect. Method 300 is suitable for implementation by a metrology system such as metrology system 100 illustrated in FIG. 1 of the present invention. In one aspect, it is recognized that data processing blocks of method 300 may be carried out via a pre-programmed algorithm executed by one or more processors of computing system 130, or any other general purpose computing system. It is recognized herein that the particular structural aspects of metrology system 100 do not represent limitations and should be interpreted as illustrative only.

In block 301, an amount of measurement data associated with measurements at a first plurality of measurement sites on a wafer is collected.

In block 302, a basis of the amount of measurement data is transformed to express the amount of measurement data collected from each of the plurality of measurement sites in terms of components ranked in descending order of contribution of variance of each component to the total variance of the amount of measurement data.

In block 303, a dimension of the amount of measurement data associated with each of the plurality of measurement sites is reduced to generate a reduced amount of measurement data. The reducing involves retaining a number of components having the largest contribution of variance to the total variance and eliminating all other components.

In block 304, at least a portion of the first plurality of measurement sites are grouped into a set of different groups such that a variance of the reduced amount of measurement data associated with measurement sites within each group of the set of different groups is minimized.

In block 305, a measurement site representative of each of the set of different groups is selected.

In a further embodiment, system 100 includes one or more computing systems 130 employed to perform measurements of semiconductor structures based on spectroscopic measurement data collected in accordance with the methods described herein. The one or more computing systems 130 may be communicatively coupled to one or more spectrometers, active optical elements, process controllers, etc. In one aspect, the one or more computing systems 130 are configured to receive measurement data associated with spectral measurements of structures of wafer 101.

It should be recognized that one or more steps described throughout the present disclosure may be carried out by a single computer system 130 or, alternatively, a multiple computer system 130. Moreover, different subsystems of system 100 may include a computer system suitable for carrying out at least a portion of the steps described herein. Therefore, the aforementioned description should not be interpreted as a limitation on the present invention but merely an illustration.

In addition, the computer system 130 may be communicatively coupled to the spectrometers in any manner known in the art. For example, the one or more computing systems 130 may be coupled to computing systems associated with the spectrometers. In another example, the spectrometers may be controlled directly by a single computer system coupled to computer system 130.

The computer system 130 of system 100 may be configured to receive and/or acquire data or information from the subsystems of the system (e.g., spectrometers and the like) by a transmission medium that may include wireline and/or wireless portions. In this manner, the transmission medium may serve as a data link between the computer system 130 and other subsystems of system 100.

Computer system 130 of system 100 may be configured to receive and/or acquire data or information (e.g., measurement results, modeling inputs, modeling results, reference measurement results, etc.) from other systems by a transmission medium that may include wireline and/or wireless portions. In this manner, the transmission medium may serve as a data link between the computer system 130 and other systems (e.g., memory on-board system 100, external memory, or other external systems). For example, the computing system 130 may be configured to receive measurement data from a storage medium (i.e., memory 132 or an external memory) via a data link. For instance, spectral results obtained using the spectrometers described herein may be stored in a permanent or semi-permanent memory device (e.g., memory 132 or an external memory). In this regard, the spectral results may be imported from on-board memory or from an external memory system. Moreover, the computer system 130 may send data to other systems via a transmission medium. For instance, a measurement model or an estimated parameter value determined by computer system 130 may be communicated and stored in an external memory. In this regard, measurement results may be exported to another system.

Computing system 130 may include, but is not limited to, a personal computer system, mainframe computer system, workstation, image computer, parallel processor, or any other device known in the art. In general, the term "computing system" may be broadly defined to encompass any device having one or more processors, which execute instructions from a memory medium.

Program instructions 134 implementing methods such as those described herein may be transmitted over a transmission medium such as a wire, cable, or wireless transmission link. For example, as illustrated in FIG. 1, program instructions 134 stored in memory 132 are transmitted to processor 131 over bus 133. Program instructions 134 are stored in a computer readable medium (e.g., memory 132). Exemplary computer-readable media include read-only memory, a random access memory, a magnetic or optical disk, or a magnetic tape.

As described herein, the term "critical dimension" includes any critical dimension of a structure (e.g., bottom critical dimension, middle critical dimension, top critical dimension, sidewall angle, grating height, etc.), a critical dimension between any two or more structures (e.g., distance between two structures), and a displacement between two or more structures (e.g., overlay displacement between overlaying grating structures, etc.). Structures may include three dimensional structures, patterned structures, overlay structures, etc.

As described herein, the term "critical dimension application" or "critical dimension measurement application" includes any critical dimension measurement.

As described herein, the term "metrology system" includes any system employed at least in part to characterize a specimen in any aspect, including measurement applications such as critical dimension metrology, overlay metrology, focus/dosage metrology, and composition metrology. However, such terms of art do not limit the scope of the term "metrology system" as described herein. In addition, the system 100 may be configured for measurement of patterned wafers and/or unpatterned wafers. The metrology system may be configured as a LED inspection tool, edge inspection tool, backside inspection tool, macro-inspection tool, or multi-mode inspection tool (involving data from one or more platforms simultaneously), and any other metrology or inspection tool that benefits from the techniques described herein.

Various embodiments are described herein for a semiconductor measurement system that may be used for measuring a specimen within any semiconductor processing tool (e.g., an inspection system or a lithography system). The term "specimen" is used herein to refer to a wafer, a reticle, or any other sample that may be processed (e.g., printed or inspected for defects) by means known in the art.

As used herein, the term "wafer" generally refers to substrates formed of a semiconductor or non-semiconductor material. Examples include, but are not limited to, monocrystalline silicon, gallium arsenide, and indium phosphide. Such substrates may be commonly found and/or processed in semiconductor fabrication facilities. In some cases, a wafer may include only the substrate (i.e., bare wafer). Alternatively, a wafer may include one or more layers of different materials formed upon a substrate. One or more layers formed on a wafer may be "patterned" or "unpatterned." For example, a wafer may include a plurality of dies having repeatable pattern features.

A "reticle" may be a reticle at any stage of a reticle fabrication process, or a completed reticle that may or may not be released for use in a semiconductor fabrication facility. A reticle, or a "mask," is generally defined as a substantially transparent substrate having substantially opaque regions formed thereon and configured in a pattern. The substrate may include, for example, a glass material such as amorphous $SiO_2$. A reticle may be disposed above a resist-covered wafer during an exposure step of a lithography process such that the pattern on the reticle may be transferred to the resist.

One or more layers formed on a wafer may be patterned or unpatterned. For example, a wafer may include a plurality of dies, each having repeatable pattern features. Formation and processing of such layers of material may ultimately result in completed devices. Many different types of devices may be formed on a wafer, and the term wafer as used herein is intended to encompass a wafer on which any type of device known in the art is being fabricated.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

Although certain specific embodiments are described above for instructional purposes, the teachings of this patent document have general applicability and are not limited to the specific embodiments described above. Accordingly, various modifications, adaptations, and combinations of various features of the described embodiments can be practiced without departing from the scope of the invention as set forth in the claims.

What is claimed is:

1. A system comprising:
a high throughput metrology tool including an illumination source and a detector configured to collect an amount of measurement data from a first plurality of measurement sites on a wafer; and
a computing system configured to:
receive the amount of measurement data associated with the measurements at the plurality of measurement sites;
transform a basis of the amount of measurement data to express the amount of measurement data collected from each of the plurality of measurement sites in terms of components ranked in descending order of contribution of variance of each component to the total variance of the amount of measurement data;
reduce a dimension of the amount of measurement data associated with each of the plurality of measurement sites to generate a reduced amount of measurement data, wherein the reducing involves retaining a number of components having the largest contribution of variance to the total variance and eliminating other components;
group at least a portion of the first plurality of measurement sites into a set of different groups such that a variance of the reduced amount of measurement data associated with measurement sites within each group of the set of different groups is minimized; and
select a measurement site representative of each of the set of different groups.

2. The system of claim 1, wherein the selecting of the measurement site location involves determining a distance between the reduced amount of data associated with each measurement site within each group and a center point of each group, and selecting a die location of a measurement site having the smallest distance as the measurement site representative of each of the set of different groups.

3. The system of claim 1, wherein the grouping of at least a portion of the first plurality of measurement sites into a set of different groups involves a clustering analysis or a classification analysis.

4. The system of claim 3, wherein the grouping of at least a portion of the first plurality of measurement sites into a set of different groups involves a K-means clustering analysis involving a minimization of normalized inertia.

5. The system of claim 1, the computing system further configured to:
remove the amount of measurement data associated with the measurements at one or more of the plurality of measurement sites based on a spatial location of the one or more measurement sites on the wafer before the transforming of the basis of the amount of measurement data.

6. The system of claim 5, wherein one or more of the plurality of measurement sites are located at or near an edge of the wafer.

7. The system of claim 5, wherein one or more of the plurality of measurement sites have a radial location beyond a pre-determined threshold value.

8. The system of claim 1, the computing system further configured to:
determine a modified Z-score associated with each amount of measurement data collected from each of the plurality of measurement sites and each component;
determine the modified Z-score having a maximum value for each amount of measurement data collected from each of the plurality of measurement sites; and
compare the maximum value of the modified Z-score associated with each amount of measurement data collected from each of the plurality of measurement sites with a predetermined threshold value, wherein the amount of measurement data collected from a measurement site is removed from the amount of measurement data if the maximum value of the modified Z-score associated with the amount of measurement data collected from the measurement site exceeds the predetermined threshold value.

9. The system of claim 1, the computing system further configured to:
append the reduced amount of measurement data associated with each of the plurality of measurement sites with one or more additional elements including one or more spatial coordinates characterizing a spatial location of the measurement site on the wafer.

10. The system of claim 1, wherein the transforming of the basis of the amount of measurement data involves any of a Principal Component Analysis (PCA), a kernel PCA, a Canonical Correlation Analysis (CCA), an Independent Component Analysis (ICA), and a factor analysis.

11. The system of claim 1, wherein each of the plurality of measurement sites on the wafer is located at a different die.

12. The system of claim 1, wherein the metrology tool is a spectroscopic metrology tool.

13. A method comprising:
collecting an amount of measurement data associated with measurements at a first plurality of measurement sites on a wafer;
transforming a basis of the amount of measurement data to express the amount of measurement data collected from each of the plurality of measurement sites in terms of components ranked in descending order of contribution of variance of each component to a total variance of the amount of measurement data;
reducing a dimension of the amount of measurement data associated with each of the plurality of measurement sites to generate a reduced amount of measurement data, wherein the reducing involves retaining a number of components having the largest contribution of variance to the total variance and eliminating other components;
grouping at least a portion of the first plurality of measurement sites into a set of different groups such that a variance of the reduced amount of measurement data associated with measurement sites within each group of the set of different groups is minimized; and
selecting a measurement site representative of each of the set of different groups.

14. The method of claim 13, wherein the selecting of the measurement site location involves determining a distance between the reduced amount of data associated with each measurement site within each group and a center point of each group, and selecting a die location of a measurement site having the smallest distance as the measurement site representative of each of the set of different groups.

15. The method of claim 13, wherein the grouping of at least a portion of the first plurality of measurement sites into a set of different groups involves a K-means clustering analysis involving a minimization of normalized inertia.

16. The method of claim 13, further comprising:
removing the amount of measurement data associated with the measurements at one or more of the plurality of measurement sites based on a spatial location of the one or more measurement sites on the wafer before the transforming of the basis of the amount of measurement data.

17. The method of claim 13, further comprising:
determining a modified Z-score associated with each amount of measurement data collected from each of the plurality of measurement sites and each component;
determining the modified Z-score having a maximum value for each amount of measurement data collected from each of the plurality of measurement sites; and
comparing the maximum value of the modified Z-score associated with each amount of measurement data collected from each of the plurality of measurement sites with a predetermined threshold value, wherein the amount of measurement data collected from a measurement site is removed from the amount of measurement data if the maximum value of the modified Z-score associated with the amount of measurement data collected from a measurement site exceeds the predetermined threshold value.

18. The method of claim 13, further comprising:
appending the reduced amount of measurement data associated with each of the plurality of measurement sites with one or more additional elements including one or more spatial coordinates characterizing a spatial location of the measurement site on the wafer.

19. A system comprising:
a high throughput metrology tool including an illumination source and a detector configured to collect an amount of measurement data from a first plurality of measurement sites on a wafer; and
a non-transitory, computer-readable medium storing instructions, that when executed by one or more processors of a computing system, cause the computing system to:
receive the amount of measurement data associated with the measurements at the plurality of measurement sites;
transform a basis of the amount of measurement data to express the amount of measurement data collected from each of the plurality of measurement sites in terms of components ranked in descending order of contribution of variance of each component to the total variance of the amount of measurement data;
reduce a dimension of the amount of measurement data associated with each of the plurality of measurement sites to generate a reduced amount of measurement data, wherein the reducing involves retaining a number of components having the largest contribution of variance to the total variance and eliminating other components;

group at least a portion of the first plurality of measurement sites into a set of different groups such that a variance of the reduced amount of measurement data associated with measurement sites within each group of the set of different groups is minimized; and select a measurement site representative of each of the set of different groups.

20. The system of claim 19, wherein the selecting of the measurement site location involves determining a distance between the reduced amount of data associated with each measurement site within each group and a center point of each group, and selecting a die location of a measurement site having the smallest distance as the measurement site representative of each of the set of different groups.

* * * * *